(12) United States Patent
Latuperissa

(10) Patent No.: US 11,647,614 B2
(45) Date of Patent: May 9, 2023

(54) PORTABLE DATA CENTER AND SERVER RACK SYSTEM WITH INTEGRATED ELECTROMAGNETIC PULSE PROTECTION

(71) Applicant: John Latuperissa, Edgewater, MD (US)

(72) Inventor: John Latuperissa, Edgewater, MD (US)

( * ) Notice: Subject to any disclaimer, the term of this patent is extended or adjusted under 35 U.S.C. 154(b) by 0 days.

(21) Appl. No.: 16/901,244

(22) Filed: Jun. 15, 2020

(65) Prior Publication Data

US 2021/0392797 A1    Dec. 16, 2021

Related U.S. Application Data

(63) Continuation of application No. 16/901,244, filed on Jun. 15, 2020.

(60) Provisional application No. 62/863,159, filed on Jun. 18, 2019.

(51) Int. Cl.
*H05K 9/00* (2006.01)
*H05K 7/20* (2006.01)
*H05K 7/14* (2006.01)

(52) U.S. Cl.
CPC ......... *H05K 9/0015* (2013.01); *H05K 7/1489* (2013.01); *H05K 7/20754* (2013.01)

(58) Field of Classification Search
CPC ............ H05K 9/0015; H05K 7/20754; H05K 7/1489; G06F 1/1632; G06F 1/1635; G06F 1/1647; G06F 1/1656
See application file for complete search history.

(56) References Cited

U.S. PATENT DOCUMENTS

| | | | | |
|---|---|---|---|---|
| 3,997,819 A * | 12/1976 | Eggert | ..................... | H05K 5/06 361/704 |
| 5,388,995 A * | 2/1995 | Rudy, Jr. | ............... | H05K 7/1449 439/61 |
| 6,120,116 A * | 9/2000 | Phillips | .............. | A47B 47/0041 211/41.17 |
| 6,166,919 A * | 12/2000 | Nicolici | ............... | H05K 7/1454 174/365 |
| 7,264,490 B1 * | 9/2007 | Reznikov | ......... | H01R 13/62933 439/152 |
| 7,372,705 B1 * | 5/2008 | Spivey | ............... | H05K 7/20445 174/520 |
| 7,876,575 B2 * | 1/2011 | Hosokawa | ........ | H01L 21/67383 361/797 |
| 7,916,487 B2 * | 3/2011 | Bitton | ..................... | G06F 21/70 361/724 |
| 10,420,258 B1 * | 9/2019 | Rahilly | ................ | H05K 9/0016 |
| 10,429,887 B2 * | 10/2019 | Arnouse | ............ | H05K 7/20736 |
| 10,638,635 B2 * | 4/2020 | Arnouse | ............ | H05K 7/20709 |
| 2002/0070043 A1 * | 6/2002 | Kitajima | ................ | H02G 3/088 174/50 |

(Continued)

*Primary Examiner* — Abhishek M Rathod

(57) ABSTRACT

A portable server data center and server rack system, includes a carrying case sized to allow the carrying case to be carried onboard an aircraft. A server tray rack rail apparatus is disposed within the carrying case to accommodate a plurality of server trays that are slidable along the rack rail apparatus. Each of the server trays are capable of accommodating a motherboard section and its components, a power supply section and its components, and a cooling apparatus for the motherboard and power supply sections.

9 Claims, 10 Drawing Sheets

(56) References Cited

U.S. PATENT DOCUMENTS

| | | | |
|---|---|---|---|
| 2002/0125799 A1* | 9/2002 | Landsberger | B01L 1/02 312/209 |
| 2003/0169982 A1* | 9/2003 | Amorim | G02B 6/4277 385/92 |
| 2006/0260838 A1* | 11/2006 | Ariel | H05K 9/0015 174/350 |
| 2014/0216806 A1* | 8/2014 | Poulsen | H05K 9/0015 174/351 |
| 2015/0289388 A1* | 10/2015 | Conway | H05K 7/1471 312/236 |
| 2015/0370666 A1* | 12/2015 | Breakstone | G06F 3/0635 714/6.3 |
| 2017/0257972 A1* | 9/2017 | Frink | H05K 7/1485 |
| 2021/0059080 A1* | 2/2021 | Embleton | H05K 9/0062 |

* cited by examiner

Front View

Rear View

PORTABLE DATA CENTER AND SERVER RACK SYSTEM WITH INTEGRATED ELECTROMAGNETIC PULSE PROTECTION

REFERENCE TO RELATED APPLICATIONS

The present application is a continuation of, and claims priority to, U.S. patent application Ser. No. 16/901,244 filed Jun. 15 2020, entitled "Portable Data Center and Server Rack System with Integrated Electromagnetic Pulse Protection," which in turn claims priority to Provisional Application No. 62/863,159 of John Latuperissa, entitled "Advanced Cyber Operations Threat Detection and Analysis Mobile Air Toolkit", filed Jun. 18, 2019, the contents of which are incorporated herein by reference in its entirety.

BACKGROUND OF THE INVENTION

This invention relates generally to a portable data center in a lightweight, flyway configuration with integrated electromagnetic interference (EMI) and electromagnetic pulse (EMP) protection, that can be transported, set-up and operated by a single person. The data center can contain, for example, hardware and software products selected and optimized for commercial or military purposes, for analyzing network traffic in real-time to detect malware, intrusions and other threats to any data network.

Commercial and government cybersecurity systems sometimes lack adequate cybersecurity protections to identify and reduce the threat of malicious cyberspace attacks, or fully understand or have situational awareness as to what is really happening inside their networks. This deficiency leaves these systems vulnerable to unauthorized, and surreptitious cyber activity that could result in data corruption, and mission disruption/degradation.

For example, Defensive Cyberspace Operations (DCO) analyze network traffic in real-time to detect malware, intrusions and other threats to any data network. Most current legacy DCO systems, however, involve large server racks (e.g., 16U rack(s) or larger) to house the necessary server capacity and hardware appliances to conduct sufficient network assessments in the field.

One drawback is that these large server systems must be shipped via commercial cargo means, which induces significant time delays when trying to respond to emerging network threats in the field. Another drawback is that these legacy DCO systems that are shipped around the world would not survive an electromagnetic pulse (EMP) from an adversary, because the server racks and case enclosure are not EMP hardened.

A need exists therefore, for a highly mobile, modular, rapidly deployable, scalable and lightweight data center system that can be carried onboard a commercial aircraft and that provides a solution for these shipping and EMP drawbacks, and which can still work seamlessly with legacy cyberspace operations systems.

SUMMARY OF THE INVENTION

The inventive design described herein is referred to as the Mobile Air Cybersecurity Kit (MACK) Box. The MACK Box greatly enhances current legacy capabilities by being able to incorporate state-of-the-art, next-generation commercial technology for data collection in the field, while greatly improving the scalability of the system, and in parallel reducing and optimizing the form factor for maximum portability, and further providing a layered approach to EMP protection. In the embodiments described herein, any number of server trays can be accommodated with a carrying case sized to be carried onboard a commercial aircraft. The server trays can house servers, routers, switches, and other standard data center processing apparatus.

More specifically, one broad embodiment of the present comprises a portable, four-sever data center housed in a carrying case that is sized to fit in the overhead bin of a commercial aircraft ("suitcase-sized"), and includes an enhanced air flow and cooling design, for consistent and reliable operations in austere or harsh environments.

A second broad embodiment comprises a portable, two-sever data center housed in a carrying case that is sized to fit under the seat of a commercial aircraft ("briefcase-sized"), and includes an enhanced air flow and cooling design, for consistent and reliable operations in austere or harsh environments.

The carrying cases employ an Electromagnetic Pulse (EMP) hardened case design, with several layers of protection, which also provides Electromagnetic Interference (EMI) and TEMPEST shielding capabilities, thereby protecting sensitive equipment from emanating electromagnetic radiation (EMR) that may carry sensitive or classified information, and prevent it from being intercepted by adversaries.

The carrying cases also comprise a unique server tray rack rail system interface, which provides added server stability during transport and while conducting operations in the field, as well as providing for ease of server tray access/removal to facilitate customization of servers for mission requirements. Any number of 1U and 2U server trays, and combinations thereof, can be accommodated.

The carrying cases also integrate a pin-and-wheel clamping mechanism and other stability features to accommodate stacking the carrying cases on top of each other, if more computer processing capability is needed, while keeping the stacked carrying cases stable during operations.

Still further, an operator can attach and securely lock a telescopic pole to the MACK Box to accommodate, for example, a radio frequency antenna to extend RF services such as Wi-Fi, in the field, or accommodate other types of antennas.

BRIEF DESCRIPTION OF THE DRAWINGS

This invention may be more fully understood with the following detailed description and by reference to the drawings in which.

DETAILED DESCRIPTION

The National Institute of Standards and Technology (NIST) defines Defensive Cyber Operations (DCO) as passive and active cyberspace operations intended to preserve the ability to utilize friendly cyberspace capabilities and protect data, networks, net-centric capabilities, and other designated systems.

While the MACK Box is described herein with regard to cybersecurity embodiments, the invention is not limited thereto. With the ability to accommodate flexible hardware and software systems, the portable MACK Box can be utilized in a wide range of other industries, including banking, healthcare, 3D manufacturing, and similar industries where lapses in data security or data corruption can cause serious economic damage or personal causalities.

In order to effectively conduct DCO, such systems generally comprise both hardware and software solutions. The hardware includes, for example, network Terminal Access Points (TAP) that monitor events on a local network to aid administrators (or attackers) in analyzing the network, servers, laptops and operating systems to run the specific software programs. The various suites of data specific security software are customized based on industry, mission or performance requirements. The software may be commercially available, open source (free to the public), or be proprietary software provided by the customer or developed independently.

This mobile, lightweight and highly portable MACK Box data center configuration allows a DCO operator to non-intrusively TAP a customer's network, collect the customer's network data both inbound and outbound, aggregate it, store it, and analyze it using enhanced data analytics (either on-site or remotely), to detect intrusions, vulnerabilities, malware or other threats and system/data compromises. In this way, the customer is more readily able to access the threat across multiple customer sites to generate a more complete threat matrix profile.

In the embodiments described herein, any number of server trays can be accommodated with a carrying case sized to be carried onboard a commercial aircraft. The server trays can house servers, routers, switches, and other standard data center processing apparatus. We generally describe two embodiments below, a 4U height embodiment and a 2U height embodiment, but one or ordinary skill in the art would understand the invention can accommodate various combinations of 1U and 2U server trays, so long as the carrying case is able to be carried onboard a commercial aircraft.

4U Server Embodiment

Figure 1:
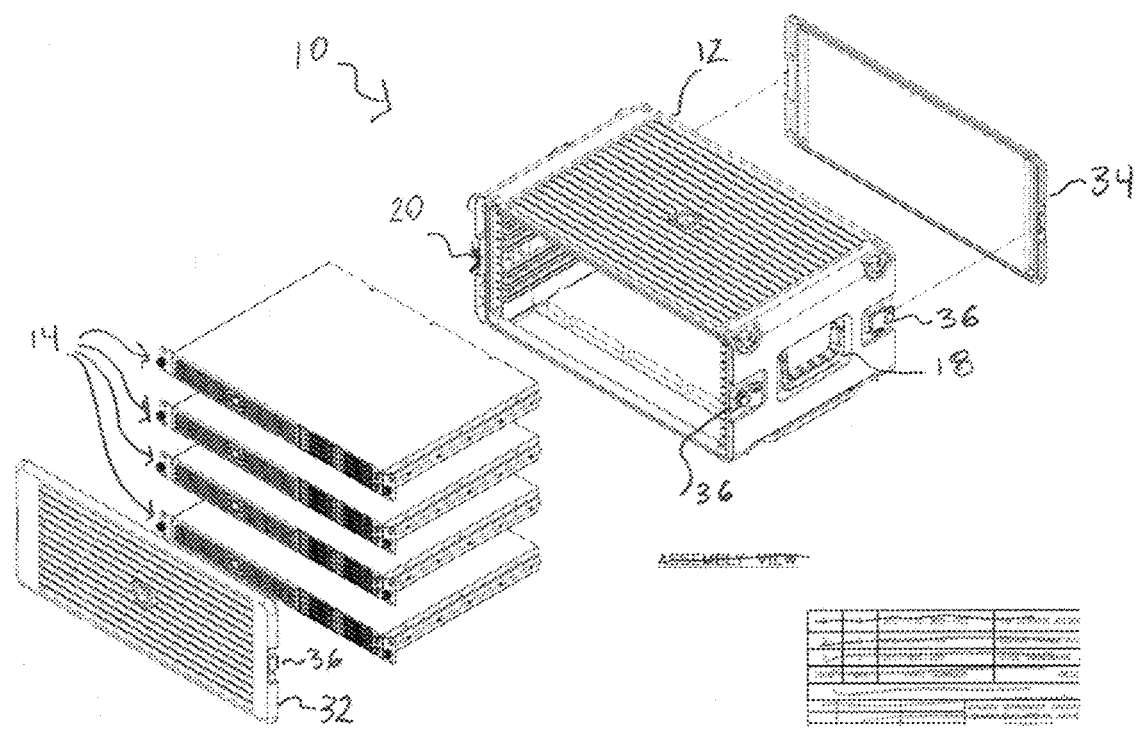
FIG. 1 is an exploded perspective view of a 4U carrying case embodiment of the present invention, including four 1U servers.
Figure 2:
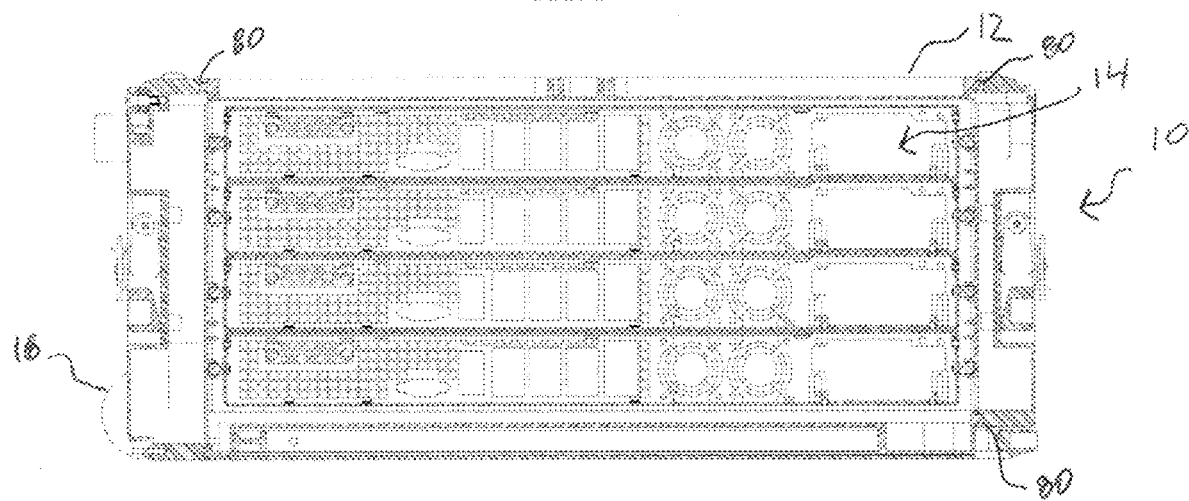
FIG. 2 is side view of the four-server carrying case embodiment of the present invention.

Referring to FIG. 1 and FIG. 2, there is shown an exploded perspective view and a side view respectively, of a 4U four-server embodiment 10 that has a suitcase-sized carrying case 12, such that it fits in a typical overhead bin of a commercial aircraft. Transportability of the carrying case 12 is desirable because frequently the capture and analysis operations must be conducted in the field, at a remote industrial site, or in austere and harsh environmental conditions, which may include exposure to extreme temperature environments as well.

In conventional server size configurations, a rack unit (abbreviated U or RU) is a unit of measure defined as 1¾ inches in height (44.45 mm). Accordingly, 1U is 1.75 inches high, 2U is 3.5 inches high and 4U is 7 inches high. The Federal Aviation Administration (FAA) specifies that the maximum size carry-on bag for most airlines is 45 linear inches (the total of the height, width, and depth of the bag). For the various airlines, although you may find an inch or two of a difference between them, the standard domestic carry-on luggage size is 22"×14"×9", which includes the handle and the wheels. Overhead bin weight restrictions for the various airlines range from 10-53 lbs., while some do not have weight restrictions.

For the 4U embodiment described above, the total weight of the MACK Box would be less than 50 pounds, with approximately 35 pounds for the case, and 15 pounds for the servers collectively. The dimensions for each 1U server tray 14 are approximately 1.75" high, 17" wide, and 12.75" in depth in this configuration. When the four 1U server trays 14 stacked on top of each other, and including the carrying case, the overall dimensions of the 4U embodiment are 8.5" high, 22" wide, and 13" in depth, including the wheels 16 and extendable handle 18, and therefore would fit within the standard 22"×14"×9" carry-on luggage size parameters of an overhead bin of a commercial aircraft.

Figure 3:
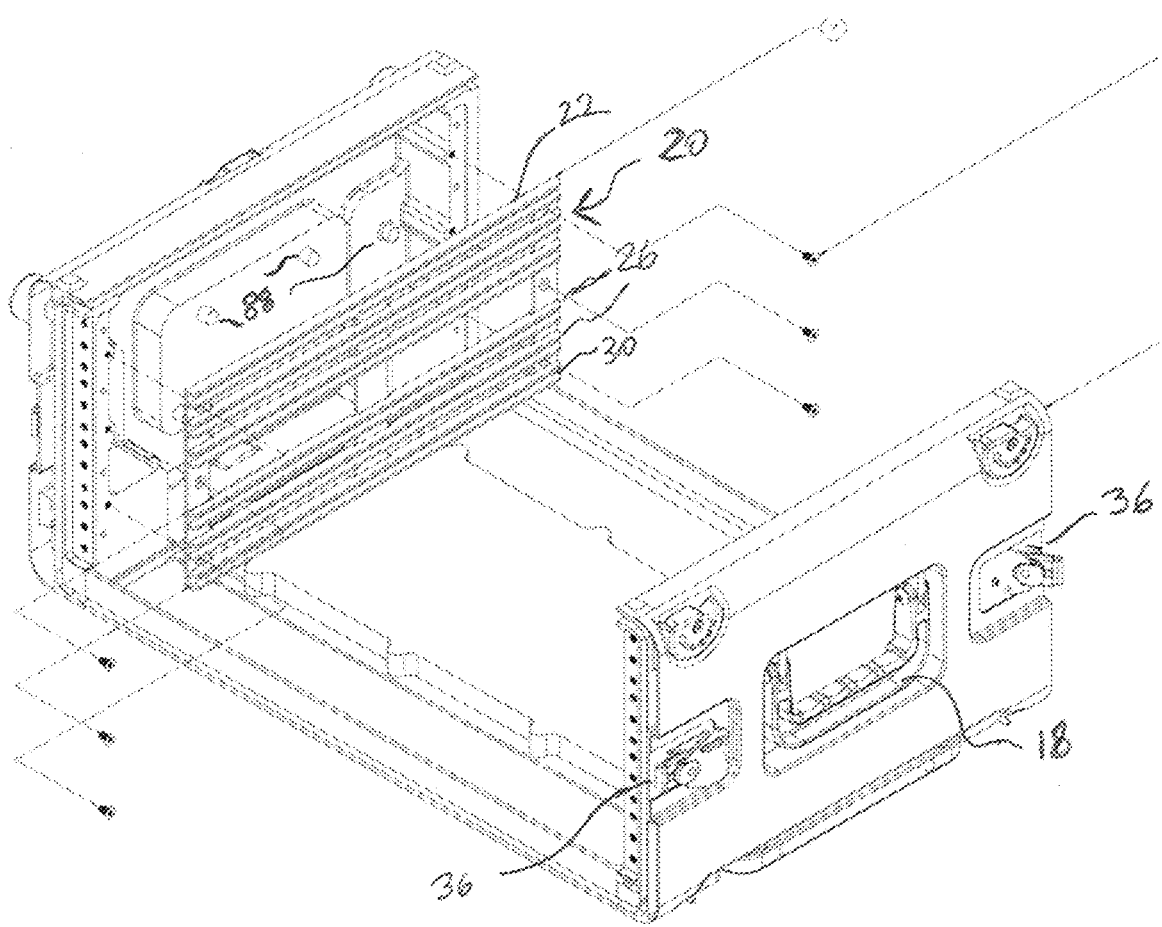
FIG. 3 is a perspective view of the server tray rack configuration of the present invention.
Figure 4:
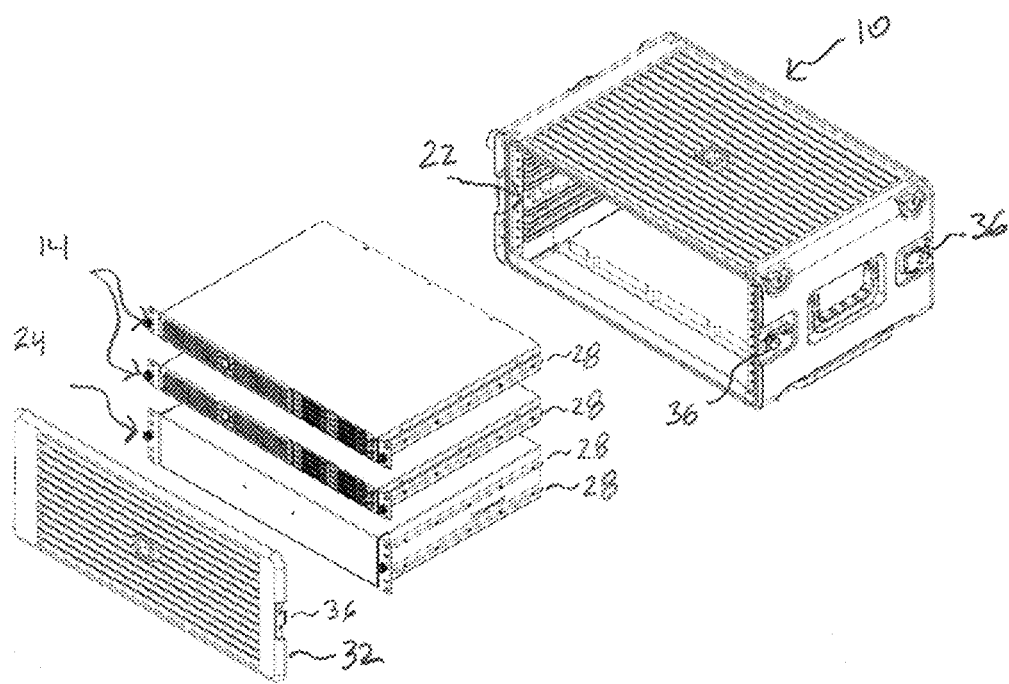
FIG. 4 is a perspective view of the server tray configuration showing an alternate configuration of 1U and 2U servers.
Figure 5:
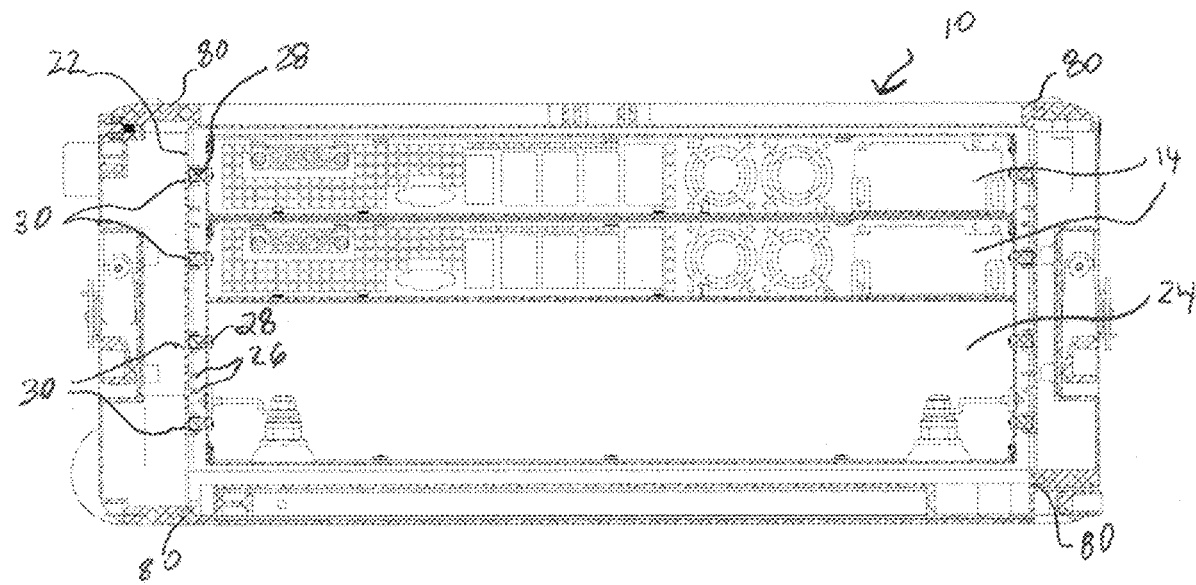
FIG. 5 is a side view of the server tray configuration showing the alternate configuration of 1U and 2U servers.

Referring again to FIG. 1 and FIG. 2, the carrying case 12 contains four 1U server trays 14 stacked vertically, which can be inserted and removed as they slide along the server tray rack rail system 20. FIG. 3, FIG. 4 and FIG. 5 provide a more complete view of the server tray rack system's 20 configurability to accommodate both 1U server trays 14 and 2U server tray 24, enabling rapid customization of different server configuration, as well as providing ease of removal and replacement for maintenance. More specifically, as shown in FIG. 3, the server tray rack rail system is disposed within the carrying case 12, and includes the opposing guide rail brackets 22 oriented along the length dimension of the carrying case 12. Each of the guide rail brackets 22 has a plurality of rack rails 26 protruding perpendicular to the guide rail brackets 22. The protruding rack rails 26 are oriented and spaced apart from each other to accommodate companion server tray protrusions 28 along the width dimension on either a 1U server tray 14 or 2U server tray 24 tray, such that the server tray protrusions 28 are slidable along and within the rack channel 30 formed between adjacent protruding rack rails 26.

The guide rail brackets 22, the protruding rack rails 26, and the server tray protrusions 28 may be manufactured from hardened plastic or lightweight metal as desired. The server tray rack rail system also includes conventional locking/unlocking mechanisms to ensure the server trays are securely fixed within the MACK Box during transport and operations, while still providing for the easy removal of the server trays 14 and 24 if desired by merely unlocking and sliding out the server trays.

As previously stated, FIG. 1 and FIG. 2 show four 1U server trays 14 stacked with the carrying case 12. Alternatively, two 1U server trays 14 and one 2U server tray 24 can be accommodated in the carrying case 12, as shown in FIG. 4 and FIG. 5, which are a perspective view and a side view, respectively. The server tray rack rail system 20 therefore enables an operator to customize the configuration, by inserting and removing server trays as needed. Also, a 1U server tray 14 or 2U server tray 24 could be provided without any internal electronic, power supply or storage components, thereby acting as a drawer for the storage of cables, electronics or circuit boards, or providing a space for storing a laptop, or housing other accessories. In still another modular configuration, a 1U server tray 14 or 2U server tray 24 can be swapped for a computer or network appliance that has a similar 1U or 2U height.

Front lid cover 32 (see, for example FIG. 1 and FIG. 4) and rear lid cover 34 (see FIG. 1) are secured to the carrying case 12, via a latching mechanism 36, to enclose the MACK Box during transport, as well as provide some EMP protection as described later below.

Cooling the Server Trays

Figure 6A:
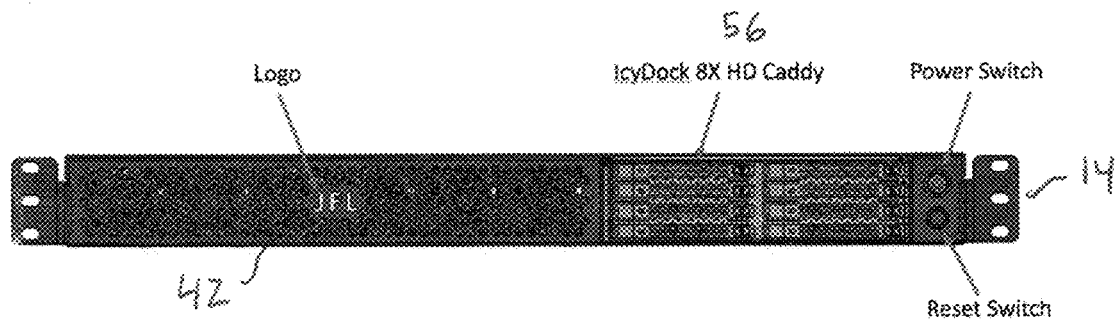
FIG. 6A is a front view of an exemplary server tray configuration for optimum cooling during operations.
Figure 6B:
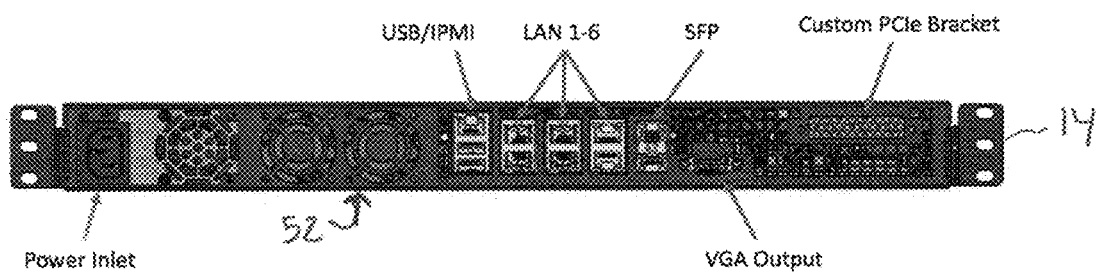
FIG. 6B is a rear view of an exemplary server tray configuration for optimum cooling during operations.
Figure 6C:
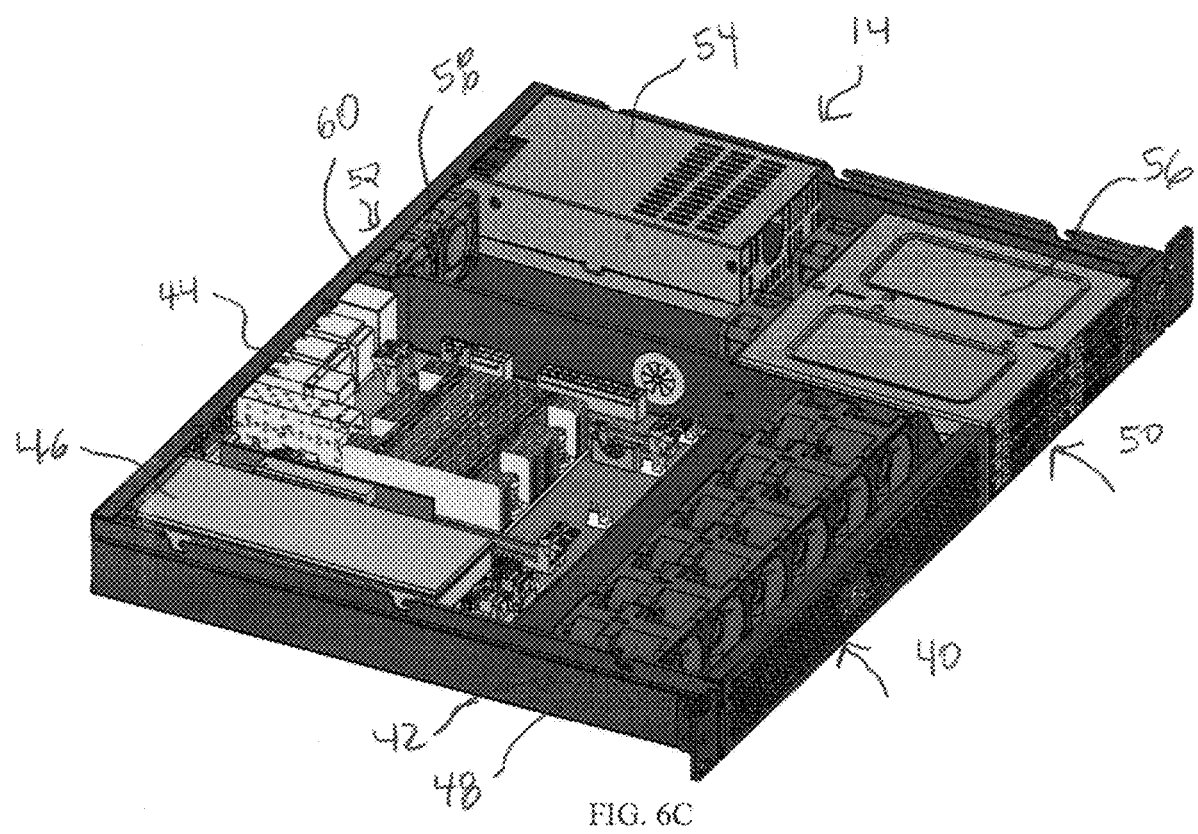
FIG. 6C is a top view of an exemplary server tray configuration for optimum cooling during operations.

Sufficient cooling of the carrying case 12 and its internal server components during operations is described referring to FIG. 6A, FIG. 6B and FIG. 6C, which are front, rear and top views, respectively, of an efficient cooling system configuration for each server tray 14 or 24. The overall server tray design creates two independent cooling paths—one for the Motherboard side 40 and a separate path for the Power Supply/Drive Caddy side 50—separated by a flow divider 60. In this exemplary embodiment, the server tray 14 is cooled by six fans 42 on the motherboard side 40 of the sever tray, and two fans 52 (plus an internal power supply fan) on the power supply/drive caddy side 50 of the server tray.

The six motherboard fans 42 provide cooling, for example to the motherboard 44 and the PCIe card 46. The PCIe (peripheral component interconnect express) card is an interface standard for connecting high-speed components. Every motherboard has a number of PCIe slots you can use to add GPUs (aka video cards or graphics cards), RAID cards, Wi-Fi cards or SSD (solid-state drive) add-on cards.

Based on the customer requirements, industry requirements, and the operating environment, one of ordinary skill in the art would select the proper motherboard 44 and PCIe card 46 to accomplish the task. The motherboard fans 42 are supported within a fan bracket 48, which not only fixes the motherboard fans 42 in place, but also blocks off any holes or spacing between the motherboard fans 42 when ingesting ambient air through the server tray 14, preventing air flow losses across the motherboard side 40 of the server tray 14. In addition to providing sufficient cooling, during operations the motherboard fans 42 should be as quiet as possible, to reduce the overall ambient noise. One exemplary embodiment of a suitable motherboard fan 42 would have a flow capacity of 30-35 CFM, and a decibel level of less than 70 dBA, which is a function of the fan RPM. During testing, six of these motherboard fans 42 provided sufficient cooling capacity to keep the operating temperature within thirty (30) degrees Celsius of ambient. One of ordinary skill in the art would understand that more or less motherboard fans 42 can be selected and provided for cooling within the scope of the invention, by conducting sufficient testing without undue experimentation.

The two power supply/storage caddy fans 52 on the power supply side 50 of the server tray 14 provide cooling to the power supply 54 and storage array 56. The power supply 54 also typically contains its own internal cooling fan (not shown). Similar to the motherboard fans, the power supply fans 54 are supported within a fan bracket 58, which not only fixes the power supply fans 52 in place, but also blocks off any holes or spacing between the power supply fans 52 when ingesting ambient air through the server tray 14, preventing air flow losses across the power supply side 50 of the server tray 14. In addition to sufficient cooling, during operations the power supply fans 52 should be as quiet as possible, to reduce the overall ambient noise. One exemplary embodiment of a suitable power supply fan 52 would have a flow capacity of 12 to 16 CFM, and a decibel level of less than 50 dBA, which is a function of the fan RPM. During testing, two of these power supply fans 52 provided sufficient cooling capacity to keep the operating temperature within thirty (30) degrees Celsius of ambient. One of ordinary skill in the art would understand that more or less power supply fans 52 can be selected and provided for cooling within the scope of the invention, by conducting sufficient testing without undue experimentation.

The motherboard side 40 and power supply side 50 are separated by the flow divider 60, and the required cabling (not shown) between the two sides is run through cable pass-throughs in the partition wall, that provide an efficient seal with minimal cooling losses.

2U Server Embodiment

In some industry operations in the field, only one or two servers may be required. Also, when traveling on smaller commuter aircraft, overhead bin size may be reduced, or access to the overhead bin may be full already, depending on the order of your boarding assignment. Accordingly, a one- or two-server 2U height embodiment that is briefcase-sized, that could be carried on and fit under the seat of a commercial aircraft, would be a viable solution. In this situation, the height of the 4U server embodiment is essentially reduced by half, to ensure the overall dimensions fit under an aircraft seat.

Figure 7:
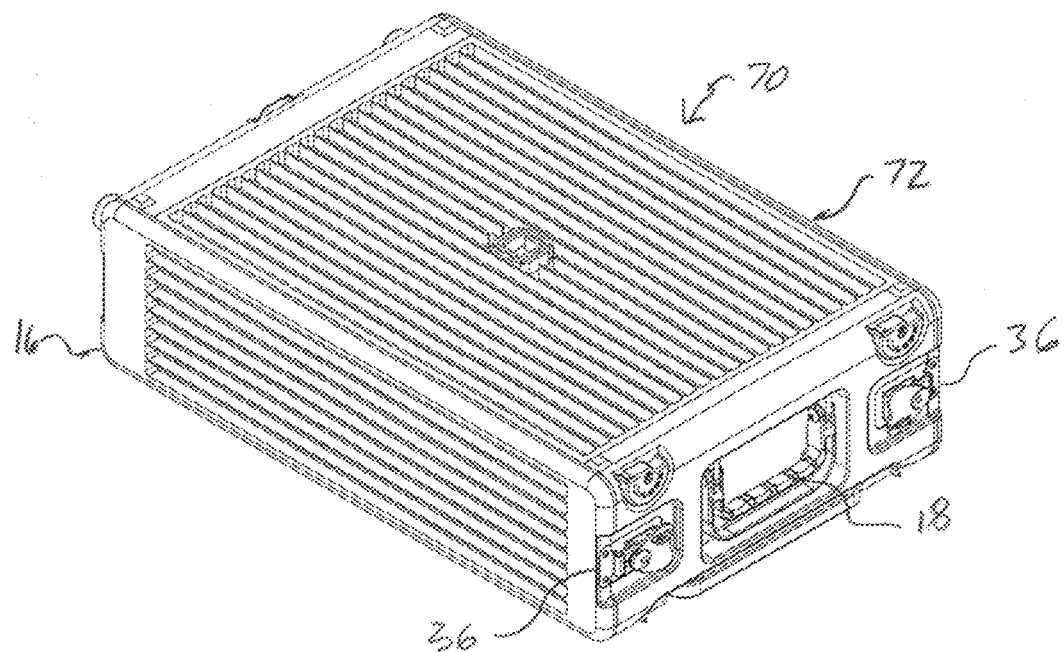
FIG. 7 is a top perspective view of a 2U carrying case embodiment of the present invention.

The space underneath a typical aircraft seat is about 20 inches wide, 17 inches long and 11 inches tall. A top perspective view of the 2U embodiment 70 of the carrying case is shown below in FIG. 7. While just the exterior is illustrated, the 2U embodiment is essentially the same structurally as the 4U embodiment, but at about one-half the height. Two 1U servers, or one 2U server can be accommodated. Similar to the 4U embodiment, within the 2U embodiment a 1U appliance or 1U drawer can be inserted in place of the 1U server. The server tray configuration and fan selection characteristics described with regard to FIG. 6A, FIG. 6B and FIG. 6C, are equally applicable to the 2U embodiment. In such a case the guide rail brackets for the 2U embodiment would be one-half the height of the guide rail brackets 22 for the 4U embodiment, but they would function in the same way.

For the 2U briefcase version, the total weight is less than 25 pounds, with approximately 18 pounds for the carrying case 72, and 7 pounds for the two servers collectively. The dimensions for the two-server embodiment are 4.25" high, 22" wide, and 13" in depth, including the wheels 16 and extendable handle 18, and therefore would fit within the standard 20"×17"×11" size parameters of the under-seat area of a commercial aircraft. Note that the 2U embodiment can be made smaller dimensionally by eliminating the wheels 16 and extendable handle 18, which would save 2" and approximately 5 pounds, making the 2U embodiment less than 20 pounds.

Electromagnetic Pulse (EMP) Hardened Carrying Case Design

Due to the nature and sensitivity of data security, cybersecurity and intelligence operations, and the potential for conducting operations near an adversary's forces if deployed for military operations, the ability to protect the electronics within the MACK Box from a dangerous Electromagnetic Pulse (EMP) is highly desirable. Also, it would be desirable for the configuration to provide Electromagnetic Interference (EMI) and TEMPEST shielding capabilities while operating the MACK Box, thereby protecting sensitive equipment from emanating electromagnetic radiation (EMR) that may carry classified information, and prevent it from being intercepted by adversaries.

By way of background, electromagnetic shielding is the practice of reducing the electromagnetic field in a space by blocking the field with barriers made of conductive or magnetic materials. Shielding is typically applied to enclosures to isolate electrical devices from their surroundings, and to cables to isolate wires from the environment through which the cable runs. Electromagnetic shielding that blocks radio frequency (RF) electromagnetic radiation is also known as RF shielding.

Electromagnetic Interference (EMI) is radio-frequency interference (RFI) due to electromagnetic radiation or induction. EMI can cause degradation of electronic equipment functionality, performance degrading or worst case disruption and switch-off. Some typical EMI-sources include: (i) wireless and radio & television broadcast transmissions; (ii) mobile telephones and wireless networks; (iii) Industrial, scientific and medical equipment; and (iv) digital processing circuitry; microcontrollers etc.

Electromagnetic Pulse (EMP) is a radiated or conducted magnetic or electrical (high frequent) pulses and transient disturbances—short burst pulses with high intensity (field strength) and energy. EMP can cause temporary or permanent switch-off and damage of electronic devices and equipment. Some typical sources include: (i) lightning (LEMP); (ii) EMP-weapons (HEMP/RFW/HPM etc.); (iii) nuclear weapons (NEMP); (iv) solar storm activity; and (v) geomagnetic disturbance (GMD).

TEMPEST (Telecommunications Electronics Materials Protected from Emanating Spurious Transmissions) is a U.S. National Security Agency specification and a NATO certification referring to gathering intelligence on information systems through leaking emanations, including unintentional radio or electrical signals, sounds, and vibrations. TEMPEST covers both methods to gather intelligence upon others and how to shield equipment against such intelligence gathering methods.

Figure 8A:
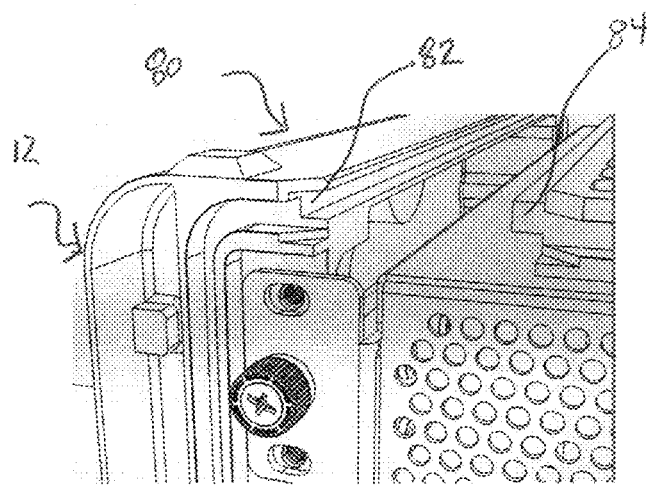
FIG. 8A is a side view of one portion of the carrying case showing a tongue-and-groove structure for connecting top and side panels of the carrying case, prior to mating the top and side panels.
Figure 8B:
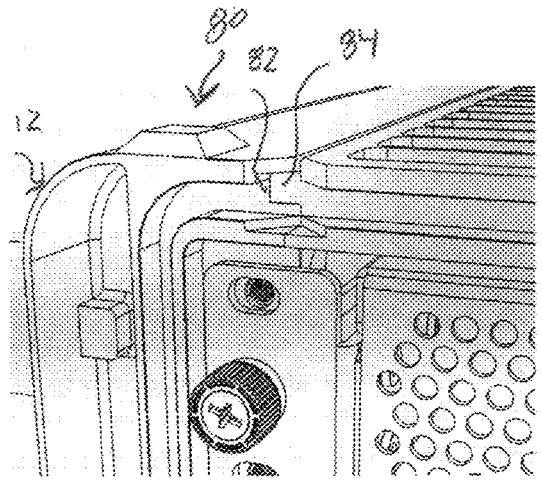
FIG. 8B is a side view of one portion of the carrying case showing a tongue-and-groove structure for connecting top and side panels of the carrying case, after mating the top and side panels.

The EMP, EMI and TEMPEST enhancements of the MACK Box (collectively EMP hardening) are achieved with three features acting in concert for layered EMP protection. In the first feature, the top, bottom and side panels of the carrying case 12 are all joined to each other via a tongue-and-groove design 80 as shown in FIG. 8A and FIG. 8B. Tongue and groove is a method of fitting similar objects together, edge to edge. Each panel has a slot 82 (the groove) cut all along one edge, and a thin, deep protrusion 84 (the tongue) on the opposite edge. The tongue 84 projects a little less than the depth of the groove 82. This tongue-and-groove design 80 creates an inherent impediment to the path of EMR, by forcing 90-degree and 180-degree flow paths. FIG. 8A is a side view of one portion of the carrying case 12 showing a tongue and groove structure 80 prior to mating the top and side panels of the carrying case 12. FIG. 8B shows the tongue 84 and groove 82 after to mating the top and side panels of the carrying case 12. This tongue and groove structure 80 is also shown in the side cross-sectional view of views of FIG. 2 and FIG. 5.

Then, in a second feature, once the panels are assembled, the top, bottom, and side panels are all TIG-welded internally, and later machined smooth, to ensure there are no seams. The TIG-welded seams also provide a more rigid case design to protect the servers during transport or operation. Also, any screw or fastener holes that would pass through the outer surface of the panels are covered or encased 88 on the inner surface of the panel as part of the integrated panel design, as best shown in FIG. 3, to ensure there is no EMI leakage.

Figure 9A:
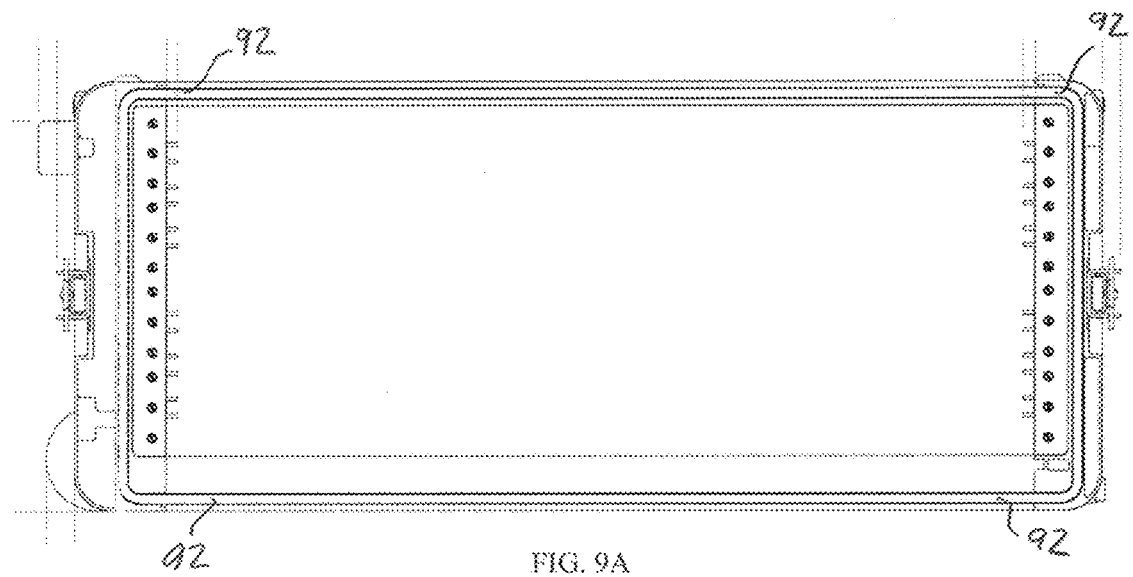
FIG. 9A is a side view of the carrying case with an EMP channel along the edges of the top, bottom and side panels of the carrying case.
Figure 9B:
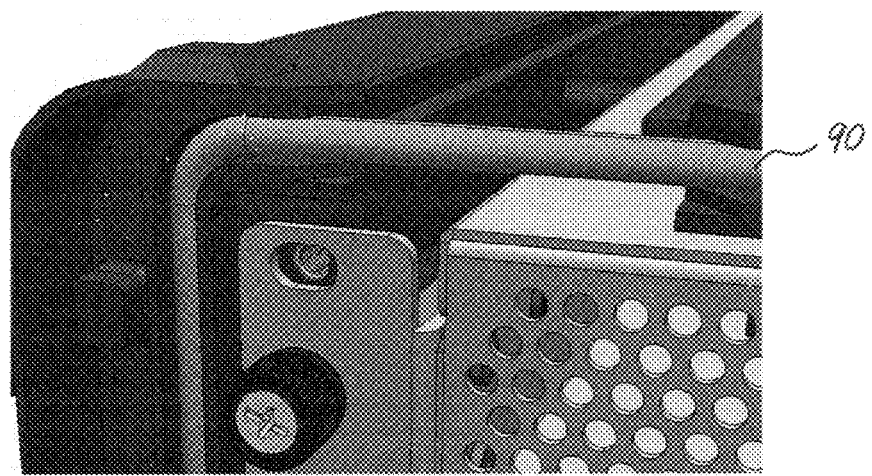
FIG. 9B is a side view of a EMP gasket disposed in the EMP channel.

A third feature incorporates an EMI shielding gasket 90 disposed with a gasket channel 92 formed along the edges of the top, bottom and side panels of the carrying case 12 as shown in FIG. 9A and FIG. 9B. FIG. 9A shows the front-side gasket channel 92. There is a similar gasket channel 92 on the back-side. The EMI shielding gasket 90 may be for example, wire mesh gasketing that provides stored data and electronics protection from the following threats when in the stowed configuration: High Altitude Electromagnetic Pulse and Intentional Electromagnetic Pulse/High-Powered Microwave threats (IEMI/HPM). In tests, the carrying case has been verified to perform above MIL-STD requirements from 300 MHz 1 GHz. One of ordinary skill in the art would understand that the shielding gasket 90 would be selected based on the anticipated threats, and that such selection could be achieved without undue experimentation.

The EMI gasket 90 would ideally be placed within the gasket channel 92, slightly oversized. The reason is that when the front lid 32 and rear lid 34 (see FIG. 1) are secured to the carrying case 12 via the latching mechanism 36, the slightly-oversized EMI gasket 90 will undergo a compressive force, for example at 20% compression, to enhance the EMP sealing capabilities, and provide somewhat of an environmental seal as well. These tongue-and-groove design 80, TIG-welded and machined seams and encased fastener holes 88, combined with the EMI gasket 90 create robust and layered EMP, EMI and TEMPEST protection.

Stackable Carrying Case Design

One can envision instances when more robust data center capacity, beyond the 4U capacity, is required for a defined set of customer, industry and data security requirements. Also, travel restrictions may require that several operators take a carrying case with them, and then set up the plurality of cases on site to accomplish the task. Accordingly, the carrying case incorporates two features to ensure the MACK Boxes can be securely and safely stacked on top of each other to conserve space while conducting operations on-site.

Figure 10A:
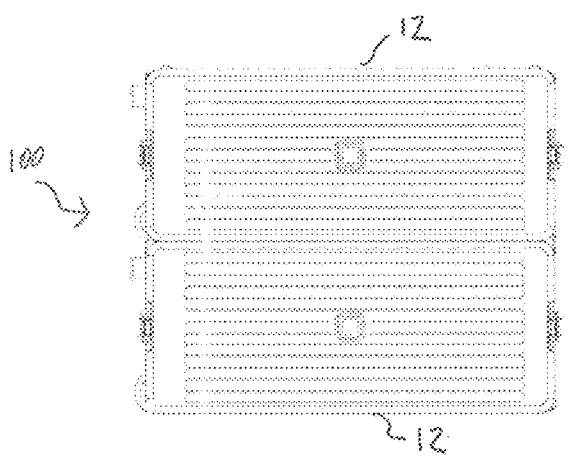
FIG. 10A is a side view of two carrying cases stacked on top of one another.
Figure 10B:
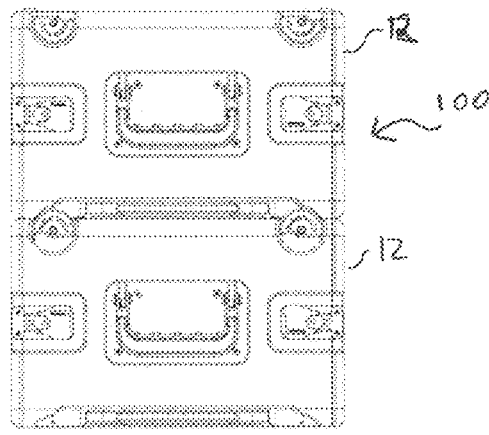
FIG. 10B is a front view of two carrying cases stacked on top of one another.
Figure 11A:
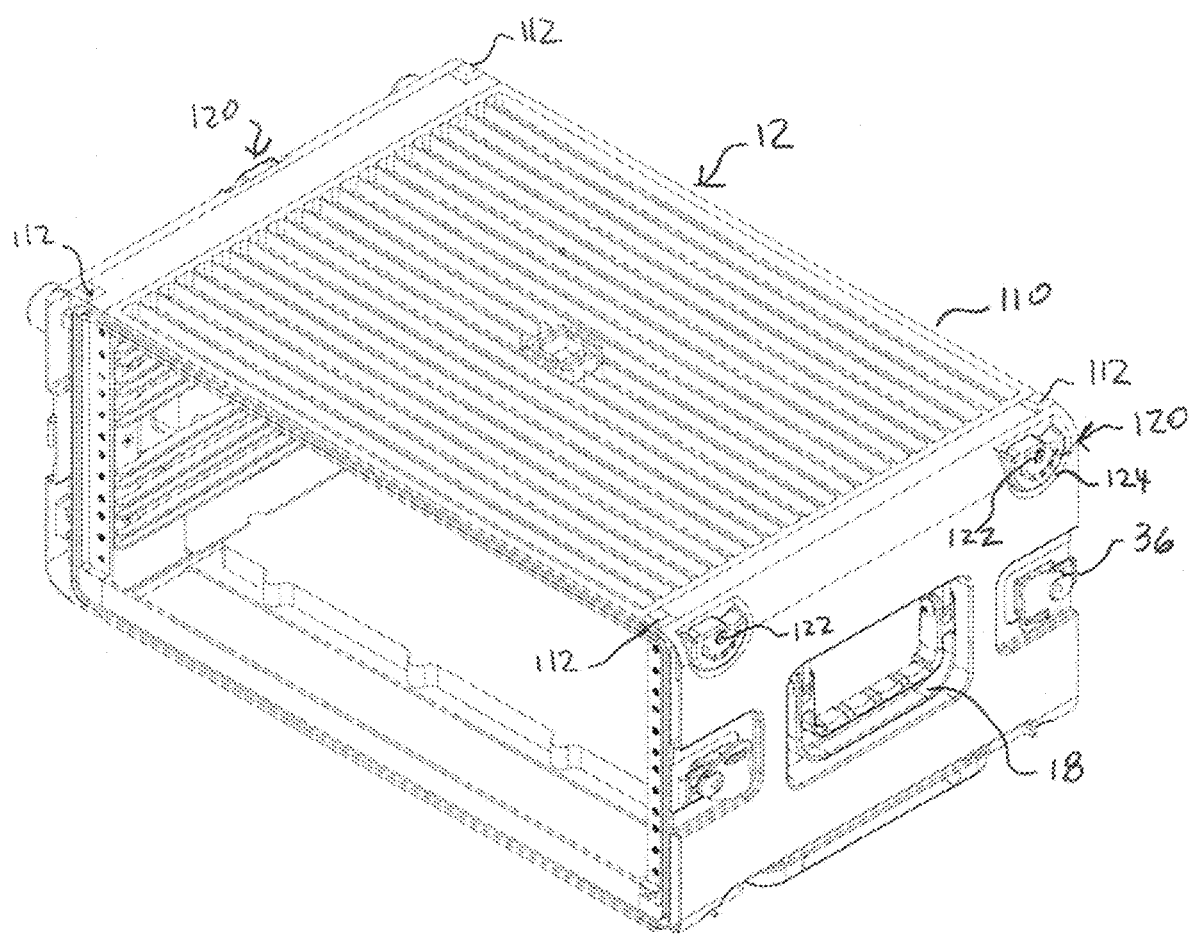
FIG. 11A is a top perspective view of the carrying case, illustrating stacking protrusions in each corner of the carrying case.
Figure 11B:
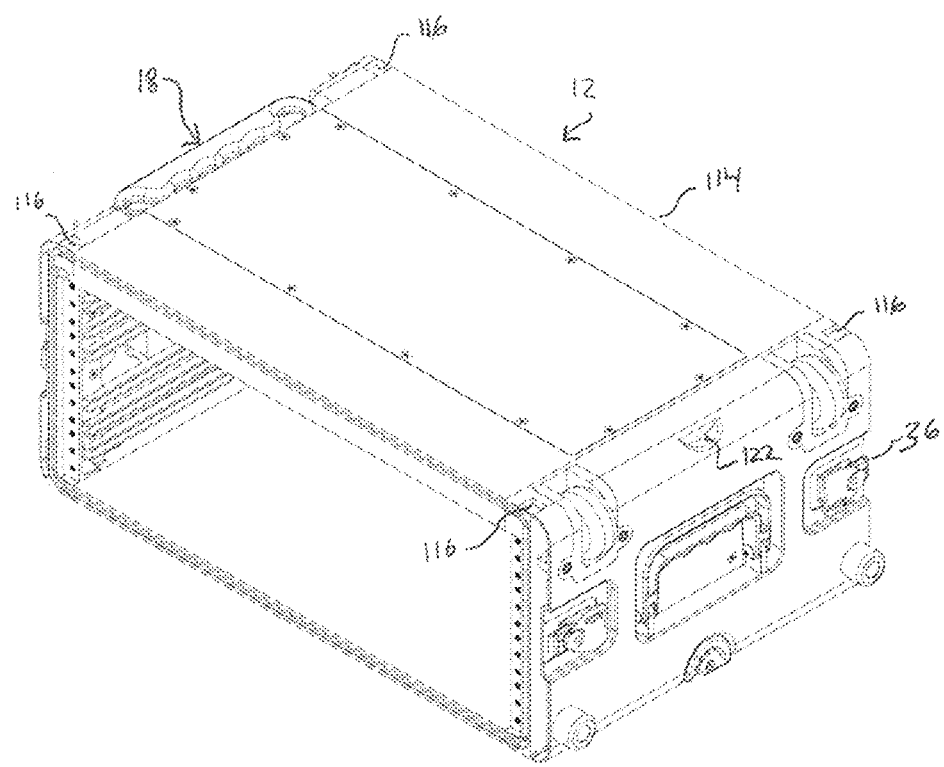
FIG. 11B is a bottom perspective view of the carrying case, illustrating stacking recesses in each corner of the carrying case.

FIG. 10A and FIG. 10B are a side view and front view, respectively, of two carrying cases 12 are placed on top of each other to create a stacked configuration 100. In FIG. 11A, a top surface 110 of the carrying case 12 has stability protrusions 112 that are positioned proximate to each corner of the top surface 110. In FIG. 11B, a bottom surface 114 of the carrying case 12 has a stability recesses 116 that are positioned proximate to each corner of the bottom surface 114, such that the stability protrusions 112 of the top surface 110 mate with the stability recesses 116 of the bottom surface 114 when the carrying cases 12 are in the stacked configuration 100 to provide stability, as shown in FIG. 10A and FIG. 10B. Two, three and even four carrying cases 12 can be stacked on each other.

Figure 12:
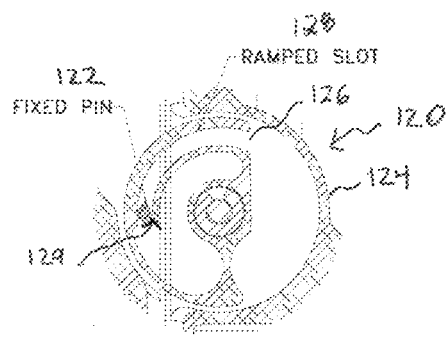
FIG. 12 is a cross-sectional view of the pin and wheel clamping mechanism when the pin and wheel are engaged.

A pin-and-wheel clamping mechanism 120 as shown with reference to FIG. 11B and FIG. 12, is provided for additional stability, especially when deployed in austere or hostile environment, where there is a greater risk of exposure to a concussive force that could shake the stack of carrying cases. As shown in FIG. 11B, the clamping mechanism 120 includes a pin 122 extending from the side panel of the carry case 12, and oriented near the bottom surface of the carrying case 12. A rotating semi-circular wheel 124 is provided on the side panel, and oriented near the top surface of the carrying case 12. In operation, and referring to FIG. 12 also, when the carrying cases 12 are placed on top of each other, the pin 122 from one carrying case 12 aligned with an opening 126 in a slot 128 oriented in the semi-circular wheel 124, when the semi-circular wheel 124 is in an unlocked position. As the semi-circular wheel 124 is rotated to a locked position, the pin 122 is received in, and is slidable along the slot 128 of the semi-circular wheel 124. When the clamping mechanism 120 is fully engaged, the pin 122 resides in a distal end 129 of the slot 128, providing that additional level of stability. Rotating the semi-circular wheel 124 in the clockwise direction locks the carrying cases 12 in place, and rotating the semi-circular wheel 124 in the counterclockwise direction unlocks the carrying cases 12. While one clamping mechanism 120 is described, more than one clamping mechanism 120 can be provided. As shown in FIGS. 10A, 10B, 11A and 11B a total of three clamping mechanisms 120 are provided—two positioned on the front side and one positioned on the back side.

Figure 13:
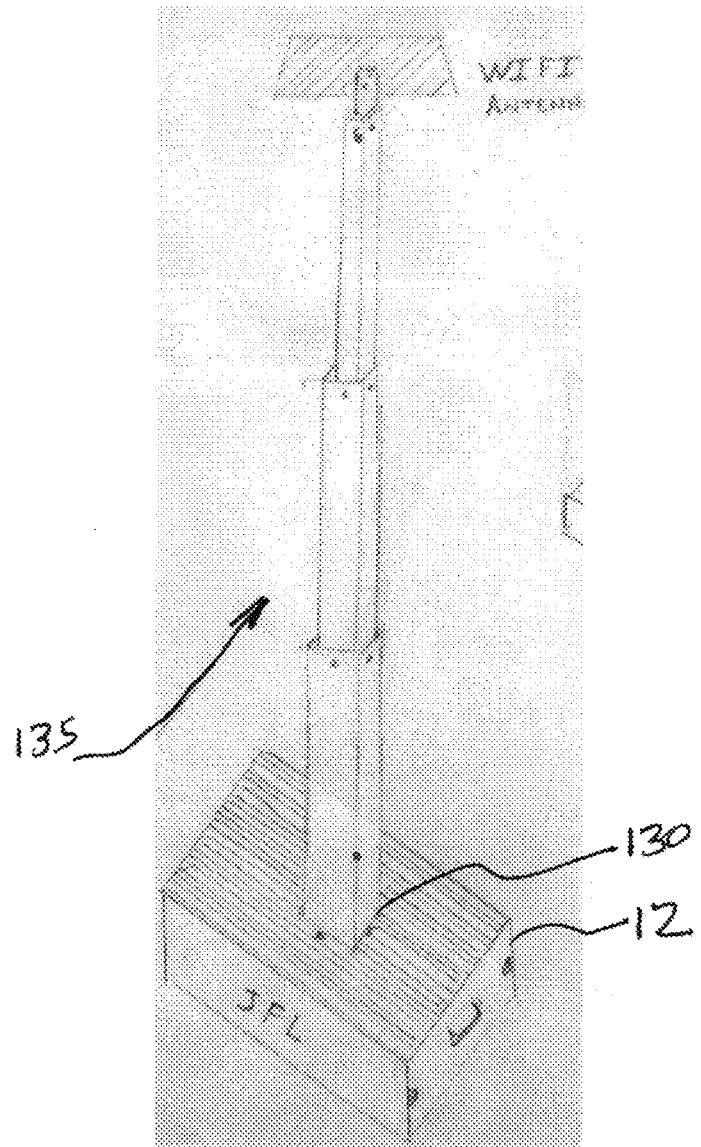
FIG. 13 is a top perspective view if an antenna attachment for the present invention.

As shown in FIG. 13 both the 2U and 4U embodiments may incorporate a securing mechanism 130 to attach and securely lock a telescopic pole 135 to the carrying case 12, to accommodate any external antennas, for example, a radio frequency antenna to extend RF services such as Wi-Fi, in the field, or accommodate other types of antennas, such as a GPS antenna. The telescoping pole is advantageous because when extended it provides increased radio frequency range, but then retracts to fit within a 1U drawer for portability.

As described above, the MACK Box packs the capabilities of a Security Operations Center (SOC) data center into a flyaway kit that can deploy anywhere in the world, and whose only limitation on deployment is the speed of air travel, because the MACK Box will be flying within the passenger cabin of the airplane. The MACK Box enables operators to rapidly perform advanced packet analysis of customer network traffic as well as develop an accurate network model and conduct vulnerability, configuration, and compliance scanning. These capabilities are correlated and analyzed to provide a comprehensive threat picture of customer networks. In one exemplary embodiment, for example, the MACK Box incorporates 32 terabytes of hard disk drive storage per 1U server multiplied by four servers or 128 terabytes total per MACK Box. Of course, these embodiments are fully scalable, and future embodiments can contain even more storage, as the state of the art in storage devices improves.

By employing the features and advantages of the present invention, the operator eliminates the need for specialized and lengthy shipping requirements for larger legacy systems, yet is still able to integrate seamlessly with legacy DCO systems, ensuring continuous and transparent data transfer and interoperability.

The above-described embodiments of the present invention are merely descriptive of its principles and are not to be considered limiting. The inventive features of the present invention, either singularly or in combination, can be used in many different industries, including cyber security, healthcare, banking, manufacturing, or others where data center portability and EMP protection are desired. The scope of the present invention instead shall be determined from the following claims including their equivalents.

What is claimed is:

1. A portable, EMI-shielded data center and server rack system, comprising:
   a carrying case outer enclosure, having length, width and height dimensions that are sized to allow the carrying case to be carried onboard an aircraft, the carrying case having an outer perimeter section along opposing front-side and back-sides of the carrying case, wherein the outer perimeter section is defined by the length, width and height dimensions of the carrying case;
   a server tray rack rail apparatus disposed within the carrying case, and comprising opposing guide rail brackets oriented along the length dimension of the carrying case, each of the guide rail brackets having a plurality of rack rails protruding perpendicular to the guide rail brackets, the rack rails being oriented and spaced apart from each other to define a rack channel to accommodate one or more server trays, wherein each of the server trays have elongated protrusions along their width dimension, that are slidable within the rack channel;
   an EMI front-side channel disposed within the front-side outer perimeter section of the carrying case;
   an EMI back-side channel disposed within the back-side outer perimeter section of the carrying case;
   an EMI gasket disposed within each of the EMI front-side and EMI back-side channels;
   a front-side lid and a back-side lid, that are removably attached to the carrying case via a latching mechanism, such that when the front-side lid and back-side lid are latched to the carrying case, wherein the EMI gasket disposed with the EMI front-side and EMI back-side channels seal the carrying case from EMI occurrences;
   wherein the carrying case outer enclosure further comprises a top, a bottom and side panels that are integrally joined to each other with a tongue and groove joint; and
   further comprising a welded seam along interfaces of each of the length, width and height sections joined with the tongue and groove joint.

2. The portable, EMI-shielded data center of claim 1, wherein the server trays comprise a motherboard section housing at least a motherboard and PCIe card, and a power supply section housing at least a power supply and a storage array, each of the motherboard and power supply sections having a plurality of fans disposed therein to provide cooling capacity.

3. The portable, EMI-shielded data center of claim 2, further comprising a motherboard fan bracket within the motherboard section for housing and encasing the motherboard fans, wherein the plurality of motherboard fans comprises six fans, and blocks off any gaps or spacing between the fans when ingesting ambient air through the server tray.

4. The portable, EMI-shielded data center of claim 3, further comprising a power supply fan bracket within the power supply section for housing and encasing the power supply and storage array fans, wherein the plurality of power supply and storage array fans comprises two fans, and blocks off any gaps or spacing between the fans when ingesting ambient air through the server tray.

5. The portable, EMI-shielded data center of claim 1, further comprising:
a second carrying case outer enclosure, thereby defining a plurality of carrying cases, and wherein the plurality of carrying cases are stacked vertically on each other, wherein a top surface of each of the carrying case and the second carrying case has a stability recess proximate to each corner of the top surface, and wherein a bottom surface of each of the carrying case and the second carrying case has a stability protrusion proximate to each corner of the bottom surface, wherein the stability protrusions of the second carrying case mate with the stability recesses of the carrying case when the plurality of carrying cases are stacked on each other to provide added stability.

6. The portable, EMI-shielded data center of claim 1, wherein the carrying case is sized to fit in an overhead bin of a commercial aircraft.

7. The portable, EMI-shielded data center of claim 1, wherein the carrying case is sized to fit under a seat of a commercial aircraft.

8. The portable, EMI-shielded data center of claim 6, wherein the server tray rack rail apparatus can accommodate up to 4U of server tray height within the carrying case, and wherein two 1U server trays and one 2U server tray are disposed with the carrying case.

9. The portable, EMI-shielded data center of claim 8, further comprising
an appliance drawer, of similar size to a 1U or 2U server tray, and wherein one or more server trays can be replaced with one or more appliance drawers of 1U or 2U height.

* * * * *